United States Patent
Kanzaki et al.

(10) Patent No.: US 9,972,928 B1
(45) Date of Patent: May 15, 2018

(54) CARD EDGE CONNECTOR

(71) Applicant: Mitsubishi Electric Corporation, Tokyo (JP)

(72) Inventors: Shozo Kanzaki, Tokyo (JP); Fumiaki Arimai, Tokyo (JP); Hiroyoshi Nishizaki, Tokyo (JP); Masato Nakanishi, Tokyo (JP); Shingo Iguchi, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days. days.

(21) Appl. No.: 15/672,377

(22) Filed: Aug. 9, 2017

(30) Foreign Application Priority Data

Mar. 9, 2017 (JP) ................................ 2017-044700

(51) Int. Cl.
| | |
|---|---|
| *H01R 13/50* | (2006.01) |
| *H01R 12/72* | (2011.01) |
| *H01R 12/70* | (2011.01) |
| *H01R 12/73* | (2011.01) |
| *H05K 1/14* | (2006.01) |

(52) U.S. Cl.
CPC ....... *H01R 12/721* (2013.01); *H01R 12/7005* (2013.01); *H01R 12/722* (2013.01); *H01R 12/735* (2013.01); *H05K 1/141* (2013.01)

(58) Field of Classification Search
CPC ........................... H01R 12/721; H01R 3/7034
USPC ................................ 439/637, 188; 200/51.1
See application file for complete search history.

(56) References Cited

U.S. PATENT DOCUMENTS

| | | | | | |
|---|---|---|---|---|---|
| 3,289,146 | A | * | 11/1966 | Tuchel ................. | H01R 13/112 439/630 |
| 4,106,841 | A | * | 8/1978 | Vladic ................... | H01R 23/70 439/188 |
| 4,285,565 | A | * | 8/1981 | Kirby ................... | H01R 12/721 439/637 |
| 4,514,030 | A | * | 4/1985 | Triner ................. | H01R 12/721 439/188 |
| 4,647,140 | A | * | 3/1987 | Crawford ............. | H01R 12/721 439/387 |

(Continued)

FOREIGN PATENT DOCUMENTS

| | | |
|---|---|---|
| JP | 7-050185 A | 2/1995 |
| JP | 2012-119210 A | 6/2012 |

*Primary Examiner* — Neil Abrams
(74) *Attorney, Agent, or Firm* — Sughrue Mion, PLLC; Richard C. Turner

(57) ABSTRACT

A plurality of pairs of contact terminals accommodated in a card edge connector include back surface members having one ends to which lead wires are connected and another ends being folded to form movable members. Until a circuit board of a control unit is inserted, end portions of the movable members are held in conductive contact with each other. When the circuit board is inserted, the movable members are separated and brought into contact with copper foil terminals. When the circuit board is removed, the movable members plastically deform and are opposed to each other with an initial gap smaller than a thickness dimension of the circuit board. With this arrangement, wiring inspection may be performed with opposed movable members shorted to one another, but for subsequent circuit board insertion at the second or subsequent insertion and removal of the circuit board, the movable members will be slightly separated by a gap to suppress slide abrasion during insertion.

9 Claims, 10 Drawing Sheets

(56) References Cited

U.S. PATENT DOCUMENTS

| | | | | |
|---|---|---|---|---|
| 5,277,607 | A | * | 1/1994 | Thumma .............. H01R 12/721 |
| | | | | 439/188 |
| 5,316,507 | A | * | 5/1994 | Capp .................... C10M 103/04 |
| | | | | 439/886 |
| 5,378,164 | A | * | 1/1995 | Vidacovich ............ H01R 12/82 |
| | | | | 200/51.1 |
| 5,533,907 | A | * | 7/1996 | Kozel ................ H01R 13/7034 |
| | | | | 200/51.1 |
| 6,764,345 | B1 | * | 7/2004 | Duesterhoeft ....... H01R 12/721 |
| | | | | 439/637 |

* cited by examiner

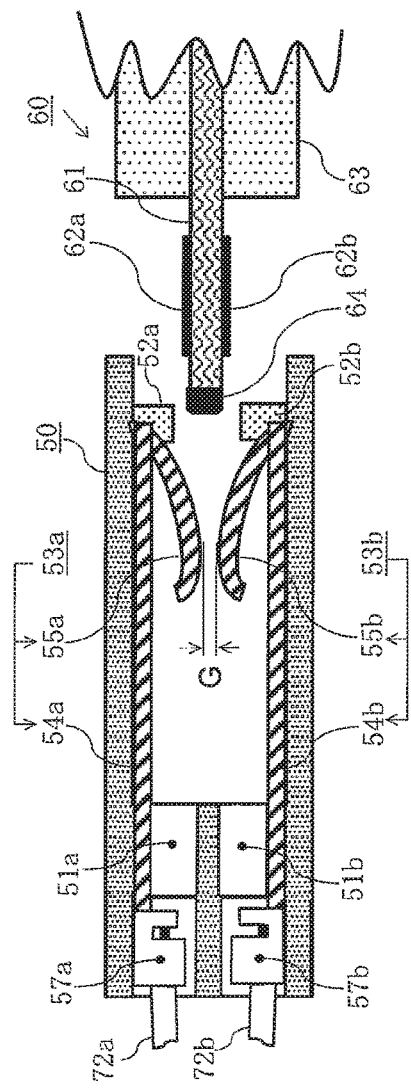
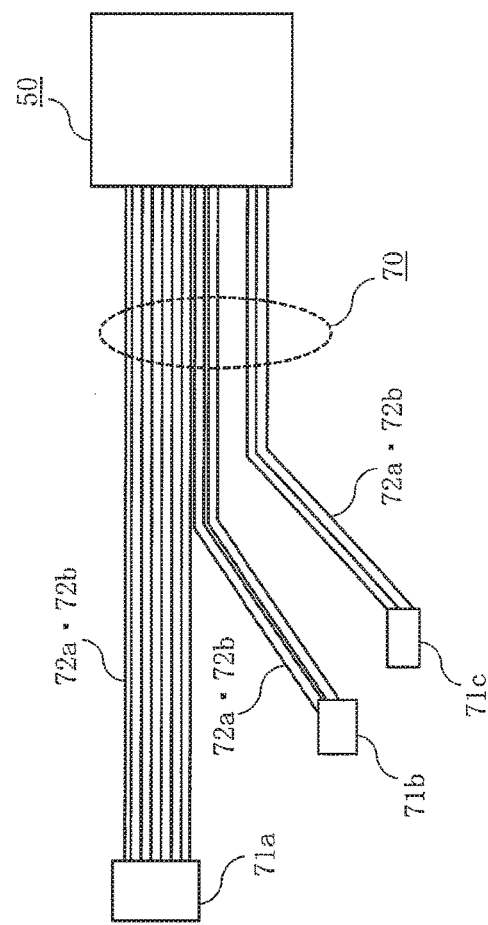
FIG. 5A
FIG. 5B

CARD EDGE CONNECTOR

BACKGROUND OF THE INVENTION

1. Field of the Invention

The present invention relates to a card edge connector which is to be used as a part of various connectors connected with a wire harness, and more particularly, to an improved card edge connector which enables easy inspection of presence or absence of erroneous wiring of a plurality of connectors.

2. Description of the Related Art

There has been provided a card edge connector, which is mainly constructed by a connector housing formed of a resin-molded material to be removably fixed to a control unit including a plurality of front and back pairs of copper foil terminals provided on both surfaces at an end portion of a circuit board. The card edge connector integrally accommodates a plurality of front and back pairs of contact terminals to be brought into conductive contact with the plurality of pairs of copper foil terminals. The card edge connector is configured to be removably mounted to the control unit. A mating connector which is adapted to such card edge connector is not commercially available. Therefore, there are various difficulties in checking wiring.

For example, in FIG. 5A for illustrating a related-art control unit and a card edge connector adapted to the control unit, there are provided front and back pairs of copper foil terminals 62a and 62b on both surfaces at an end portion of a circuit board 61 constructing a control unit 60. The copper foil terminals 62a and 62b are connected to a circuit component (not shown) sealed with integrally-molded resin 63. An end surface fixing member 64 is molded integrally with an end surface of the circuit board 61.

A card edge connector 50 includes a pair of contact terminals 53a and 53b which are provided inside a resin-molded connector housing. The contact terminals 53a and 53b are conductive members having elasticity, which are constructed by back surface members 54a and 54b and movable members 54a and 54b. The back surface members 54a and 54b have one ends to which lead wires 72a and 72b are connected through intermediation of wire connection portions 57a and 57b. The movable members 55a and 55b are formed by folding back another ends of the back surface members 54a and 54b. The pair of movable members 55a and 55b are opposed to each other with an initial gap G having a dimension smaller than a thickness dimension of the circuit board 61.

The pair of contact terminals 53a and 53b are inserted through insertion window holes 51a and 51b formed in the connector housing, respectively, and are held between the insertion window hole 51a and a stopper 52a and between the insertion window hole 51b and a stopper 52b, respectively.

Further, in FIG. 5B for illustrating an example of a wire harness with the card edge connector, a wire harness 70 includes a plurality of mating connectors 71a, 71b, and 71c which are connected to another ends of the plurality of lead wires 72a and 72b connected to the card edge connector 50. Various pieces of equipment are removably connected to the mating connectors 71a, 71b, and 71c.

In FIG. 5C for illustrating a conduction inspection device for a wire harness having such a configuration, the wire harness 70 to be subjected to inspection is connected to a conduction inspection device 90 through intermediation of the mating connectors 71a, 71b, and 71c. A dummy card 61C in place of the control unit 60 is inserted into the card edge connector 50. The dummy card 61C includes a front and back pair of copper foil terminals and a short-circuit line connecting the copper foil terminals to each other.

An indication LED 91 and a current-limiting resistor 92, which are connected to a power supply terminal Vbb, are connected to a ground terminal GND through intermediation of the pair of lead wires 72a and 72b and the dummy card 61C providing short-circuit connection between one ends of the pair of lead wires 72a and 72b. When the connection of the mating connectors 71a, 71b, and 71c to the card edge connector 50 is appropriate, the indication LED 91 turns on.

When there is no connection in any one pair of the plurality of pairs of lead wires 72a and 72b, an abnormality indication LED 94 turns on through a logical sum circuit 93.

Meanwhile, there has been known a card edge connector in which front and back connection terminals of the card edge connector are held in conductive contact with each other before a circuit board is inserted. Even though the purpose of employing such configuration is different, use of the card edge connector of such type may eliminate the need for the dummy card 61C of FIG. 5C.

For example, according to Japanese Patent Application Laid-open No. 2012-119210 entitled "CARD EDGE CONNECTOR AND ELECTRIC CIRCUIT COMPONENT" described below, both wipe portions 13c of a front and back pair of connection terminals 13A and 13B have flat portions 13s and 13s which are parallel to each other under a state in which a child board 30 is not inserted.

Under the state in which the child board 30 is not inserted, the connection terminals 13A and 13B are held in preliminary contact with each other through abutment of the flat portions 13s and 13s against each other with elasticity of the connection terminals 13A and 13B, thereby preventing entry of a foreign matter and the like from an opening side into a space between the connection terminals 13A and 13B.

Further, according to Japanese Patent Application Laid-open No. Hei 07-050185 entitled "ELECTRIC CONTACT AND ELECTRIC CONNECTOR USING THE SAME", when a daughter board 17 is inserted, a pair of contacts 10, which are made of beryllium copper and fixed to a mother board 11, are first brought into electrical contact with board contact portions 15. When the daughter board 17 is further inserted, short-circuit contact portions 16 are separated. When the daughter board 17 is removed, opposed short-circuit contact portions 16 are again brought into short-circuit contact with each other with elasticity of the contacts 10. As a result, the reliability with respect to the electric contact and the entire device is considered to be improved.

SUMMARY OF THE INVENTION

(1) Description of Problems in Related Arts

First, one of the problems in using the dummy card 61C illustrated in FIG. 5C is that it requires labor of mounting and removing the dummy card every time one wire harness is to be inspected. Further, the dummy card has a short lifetime as inspection equipment for a wire harness being a mass-produced item, with the result that cost for consumption of the dummy card being a spare item is increased.

Further, there is a problem in that chips of a board material or chips of copper foil terminals caused by slide abrasion of the dummy card may enter the card edge connector being a product and move to a control unit connected thereto in a stage of actual use, resulting in degradation of performance and quality of the control unit.

Meanwhile, as disclosed in Japanese Patent Application Laid-open No. 2012-119210 and Japanese Patent Application Laid-open No. Hei 07-050185, when the contact terminals in the card edge connector have a preliminary contact function, and the circuit board is not inserted, one of problems which may arise in a case where the front and back pair of contact terminals are held in conductive contact with each other is that a separation dimension between the contact terminals increases when the circuit board is inserted, and chips of the board material and chips of the copper foil terminals are caused by the slide abrasion of the circuit board, resulting in degradation of performance and quality of the control unit.

Further, when surface treatment as represented by, for example, gold plating is applied in order to prevent occurrence of contact failure caused by an oxide film on a contact surface, excessive wiping operation may cause separation of a plating layer, resulting in an adverse effect.

Another problem is that, when the control unit is removed by mistake under a state in which a power supply voltage is applied, the preliminary contact terminals may cause a short circuit between the power supply terminals, with the result that a power supply circuit connected to the wire harness is burnt.

(2) Object of the Invention

The present invention has an object to provide a card edge connector which is capable of enabling connection inspection for a wire harness without use of a dummy card, reducing slide abrasion of a circuit board caused by separation of the contact terminals, and preventing occurrence of power-supply short-circuit abnormality caused by the preliminary contact terminals in a stage of actual use.

According to one embodiment of the present invention, there is provided a card edge connector, which is mainly constructed by a connector housing formed of a resin-molded material to be removably fixed to a control unit including a plurality of front and back pairs of copper foil terminals provided on both surfaces at an end portion of a circuit board, the card edge connector integrally accommodating a plurality of front and back pairs of contact terminals to be brought into conductive contact with the plurality of pairs of copper foil terminals, the card edge connector being configured to be removably mounted to the control unit, in which the card edge connector constructs a wire harness including lead wires having one ends connected to the plurality of pairs of contact terminals and another ends connected to at least one mating connector, and in which each of the plurality of pairs of contact terminals includes: a front and back pair of back surface members having one ends connected to the lead wires; and a front and back pair of movable members formed integrally with the pair of back surface members.

Further, the pair of movable members are held in conductive contact with each other until the circuit board is inserted. When the circuit board is inserted, the conductive contact is released, and an elastic stress is reduced by plastic deformation of the pair of movable members. Accordingly, the circuit board is brought into conductive contact with the plurality of pairs of copper foil terminals. When the circuit board is once inserted and then removed, the plastic deformation of the pair of movable members releases the conductive contact of the pair of movable members, and the pair of movable members are opposed to each other with an initial gap having a dimension smaller than a thickness dimension of the circuit board. When the circuit board is inserted again, the initial gap is increased, and the pair of movable members are brought into conductive contact with the pair of copper foil terminals.

As described above, the card edge connector according to the present invention is connected to at least one mating connector with lead wires to construct the wire harness. The card edge connector includes the pair of contact terminals to be brought into conductive contact with the front and back pair of copper foil terminals provided on the circuit board constructing the control unit. The front and back pair of contact terminals include the movable members. When the circuit board is not inserted, the movable members are held in conductive contact with each other. When the circuit board is removed, plastic deformation of the movable members forms the initial gap between the conductive contact surfaces. The dimension of the initial gap between the movable members is equal to or less than the thickness dimension of the circuit board.

Therefore, when wiring inspection for the lead wires connected to the card edge connector is to be performed, wiring inspection is performed from the mating connector side under a state in which the circuit board is not inserted into the card edge connector. As a result, the presence or absence of erroneous wiring with respect to different pairs can be easily detected.

Further, when the circuit board is to be inserted into the card edge connector for the first time, the copper foil terminals and the contact surface portions of the contact terminals are not brought into contact with each other in a preliminary insertion stage in which the movable members are widened by the end portion of the circuit board. After an elastic stress is reduced by the plastic deformation of the movable members, the copper foil terminals and the contact surface portions of the contact terminals are brought into slide contact with each other. Therefore, the slide abrasion of the copper foil terminals is suppressed, thereby being capable of preventing occurrence of the contact failure.

At the second or subsequent removal of the circuit board, the initial gap is formed between the movable members by the plastic deformation. Therefore, formation of slide abrasion powder and application of excessive contact pressure with respect to the copper foil terminals may be suppressed.

BRIEF DESCRIPTION OF THE DRAWINGS

FIG. 5A is a sectional view of a card edge connector according to one example of a generally known mode.

FIG. 5B is an overall view of a wire harness to be applied to the card edge connector of FIG. 5A.

DESCRIPTION OF THE EMBODIMENTS

Figure 1A:
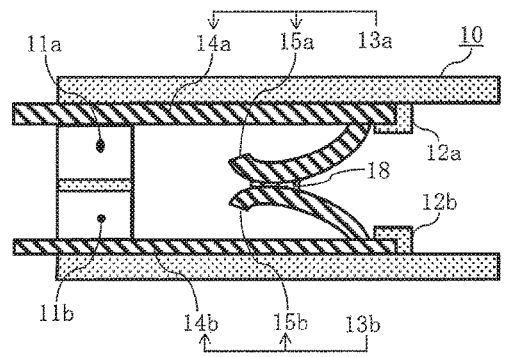
FIG. 1A is a sectional view of a card edge connector according to a first embodiment of the present invention.
Figure 1B:
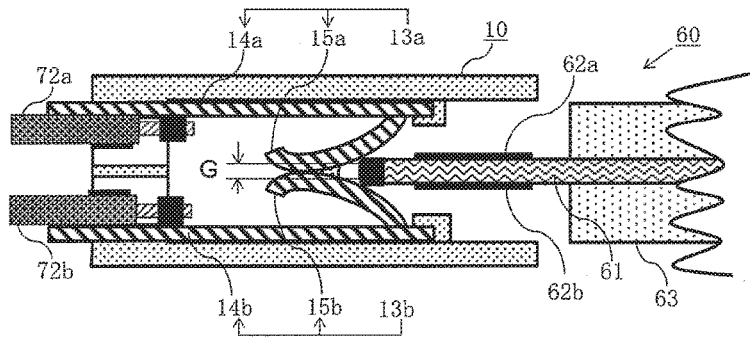
FIG. 1B is a sectional view for illustrating a state immediately before a control unit is inserted into the card edge connector of FIG. 1A.
Figure 1C:
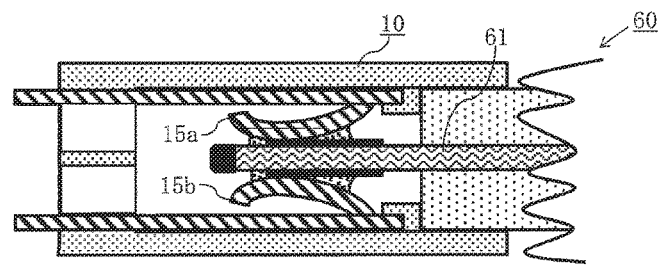
FIG. 1C is a sectional view for illustrating a state in which the control unit is completely inserted into the card edge connector of FIG. 1A.
Figure 1D:
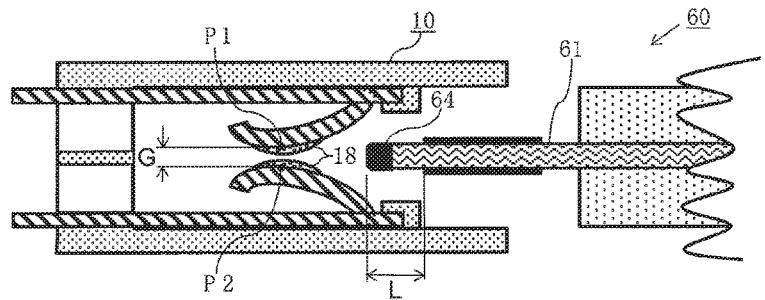
FIG. 1D is a sectional view for illustrating a state in which the control unit is completely removed from the card edge connector of FIG. 1A.

First Embodiment and Second Embodiment (1) Detailed Description of Configuration and Action of Card Edge Connector According to First Embodiment First, with reference to FIG. 1A being a sectional view for illustrating a card edge connector according to a first embodiment of the present invention, FIG. 1B being a sectional view for illustrating a state immediately before a control unit is inserted into the card edge connector of FIG. 1A, FIG. 1C being a sectional view for illustrating a state in which the control unit is completely inserted into the card edge connector of FIG. 1A, and FIG. 1D being a sectional view for illustrating a state in which the control unit is completely removed from the card edge connector of FIG. 1A, detailed description is made of a configuration and an action of the card edge connector according to the first embodiment.

In FIG. 1A and FIG. 1B, a card edge connector 10 includes a plurality of front and back pairs of contact terminals 13a and 13b provided in a resin-molded connector housing. The contact terminals 13a and 13b are conductive members having elasticity, which are constructed by back surface members 14a and 14b and movable members 15a and 15b. The back surface members 14a and 14b have one ends to which lead wires 72a and 72b (see FIG. 1B) are connected through intermediation of wire connection portions. The movable members 15a and 15b are formed by folding back another ends of the back surface members 14a and 14b. The pair of movable members 15a and 15b are held in abutment against each other before a circuit board 61 is inserted, and are brought into conductive contact with each other by breaking through a film of a non-conductive lubricating material 18 applied to contact surfaces (see FIG. 1A).

The plurality of pairs of contact terminals 13a and 13b, under a state in which the lead wires 72a and 72b are connected thereto, are inserted through insertion window holes 11a and 11b formed in the connector housing, respectively, and are held between the insertion window hole 11a and a stopper 12a and between the insertion window hole 11b and a stopper 12b, respectively.

The lubricating material 18 is commercially available as a contact oil, and may be of a conductive type or a non-conductive type. In the embodiments, the lubricating material 18 of the non-conductive type is used to prevent leakage of electricity between contact terminals provided adjacent to each other.

Meanwhile, on the control unit 60 to be connected to external equipment through intermediation of the card edge connector 10, there are provided a front and back pair of copper foil terminals 62a and 62b on both surfaces at an end portion of the circuit board 61. The copper foil terminals 62a and 62b are connected to a circuit component (not shown) sealed with integrally-molded resin 63. An end surface fixing member 64 is molded integrally with an end surface of the circuit board 61 (see FIG. 1B and FIG. 1D).

Reference holes (not shown) are formed at diagonal positions in the circuit board 61. Forming positions of the copper foil terminals 62a and 62b and an end surface position of the end surface fixing member 64 are set through use of the reference holes as common reference points. Relative positions of the copper foil terminals 62a and 62b with respect to the end surface of the end surface fixing member 64 are set so that a preliminary insertion dimension L, which is constant without unevenness, can be obtained even when the end surface position of the circuit board 61 is less accurate.

In FIG. 1C and FIG. 1D, when the circuit board 61 is inserted between the pair of movable members 15a and 15b, distal end portions of the movable members 15a and 15b are separated with fold-back positions of the back surface members 14a and 14b being supporting points, and the conductive contact between the front and back pair of movable members 15a and 15b is released. When the circuit board 61 is further inserted, the front and back movable members 15a and 15b are brought into conductive contact with the surfaces of the front and back copper foil terminals 62a and 62b, respectively (see FIG. 1C).

When the circuit board 61 is removed, plastic deformation of the movable members 15a and 15b causes contact surface portions P1 and P2 to be opposed to each other with an initial gap G. The initial gap G has a dimension which is smaller than a thickness dimension of the circuit board 61 (see FIG. 1D).

Therefore, when the circuit board 61 is inserted for the first time, and the contact surfaces portions P1 and P2 of the movable members 15a and 15b are separated from each other, a large stress is generated on the end surface fixing member 64. Along with increase in separation dimension, plastic deformation of the movable members 15a and 15b occur. As a result, the contact pressure caused by the abutment of the contact surface portions P1 and P2 against the copper foil terminals 62a and 62b is reduced. Accordingly, in cooperation with the effect of suppressing the abrasion resistance by the lubricating material 18, the slide abrasion of the copper foil terminals 62a and 62b is suppressed.

This action similarly applies to the case of inserting the circuit board 61 again. At the time of inserting the circuit board 61 again, the movable members 15a and 15b are already plastically deformed. The movable members 15a and 15b are separated by a dimension of a difference between the initial gap G and the thickness dimension of the circuit board 61. The contact pressure of the movable members 15a and 15b with respect to the copper foil terminals 62a and 62b is also reduced.

Figure 1E:
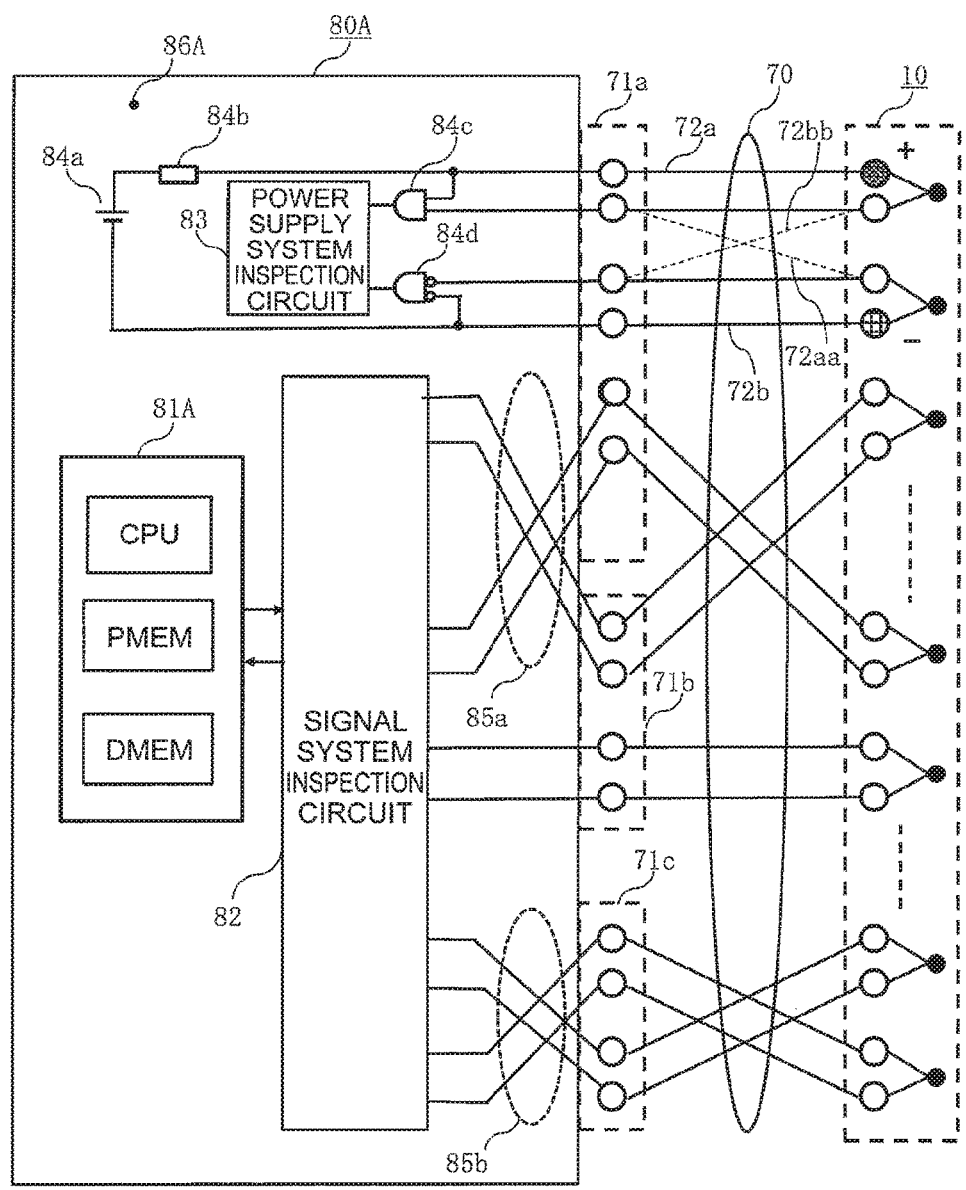
FIG. 1E is an overall configuration view of a conduction inspection device of a first mode for the card edge connector of FIG. 1A.

Next, with reference to FIG. 1E being an overall configuration view of a conduction inspection device of a first mode for the card edge connector of FIG. 1A, detailed description is made of a configuration and an action of the conduction inspection device.

In FIG. 1E, the lead wires 72a and 72b have one ends connected to the contact terminals 13a and 13b of the card edge connector 10 and another ends connected to first terminals of the mating connectors 71a, 71b, and 71c, thereby constructing a wire harness 70.

Second terminals fitted to the first terminals of the mating connectors 71a, 71b, and 71c are provided on a relay board 86A constructing a conduction inspection device 80A. With this structure, the wire harness 70 is removably connected to the relay board 86A.

In this embodiment, the pair of contact terminals illustrated at an uppermost stage of the card edge connector 10 are used as positive-side power supply terminals. The pair of contact terminals illustrated at the next stage are used as negative-side power supply terminals. The pairs of contact terminals construct a power supply system circuit, and are connected to the relay board 86A through intermediation of the mating connector 71a.

Other contact terminals of the card edge connector 10 construct a signal system circuit, and are connected to the relay board 86A through intermediation of the mating connectors 71a, 71b, and 71c.

On the relay board 86A, there are provided an arithmetic control part 81A, a signal system inspection circuit 82, and a power supply system inspection circuit 83.

A current-limiting resistor 84b is serially connected to a positive-side terminal of the control power supply 84a provided on the relay board 86A. The positive-side terminal is connected to a front surface side of the positive-side power supply terminals of the card edge connector 10 through intermediation of the mating connector 71a and the lead wire 72a.

Further, a negative-side terminal of the control power supply 84a provided on the relay board 86A is connected to a back surface side of the negative-side power supply terminals of the card edge connector 10 through intermediation of the mating connector 71a and the lead wire 72b.

When an applied voltage with respect to the lead wire 72a on the front surface side and an applied voltage with respect to a return line on the back surface side, which is a parallel circuit with respect to the lead wire 72a, are both at high level, a logical product circuit 84c provided on the relay board 86A generates a normal output logic "H" and outputs the generated normal output logic "H" to the power supply system inspection circuit 83.

When an applied voltage with respect to the lead wire 72b on the back surface side and an applied voltage with respect to a return line on the front surface side, which is a parallel circuit with respect to the lead wire 72b, are both at low level, a negative input logical product circuit 84d provided on the relay board 86A generates a normal output logic "H" and outputs the generated normal output logic "H" to the power supply system inspection circuit 83.

When the output logic of the logical product circuit 84c and the output logic of the negative input logical product circuit 84d are both "H", the power supply system inspection circuit 83 determines that the power supply system circuit is normal.

However, when the connection terminal on the back surface side of the front and back pair of connection terminals being the positive-side power supply terminals and the connection terminal on the front surface side of the pair of connection terminals being the negative-side power supply terminals cross each other by erroneous wirings 72aa and 72bb illustrated with dotted lines, the output logic of the logical product circuit 84c and the output logic of the negative input logical product circuit 84d are both at the logic level of "L", and the power supply system inspection circuit 83 determines that the power supply system circuit is abnormal.

When the wires on the front and back sides of the front and back pairs of connection terminals cross each other, erroneous wiring cannot be detected. However, when both of the front and back pair of connection terminals are the positive-side power supply terminals or the negative-side power supply terminals, there is no actual harm.

The signal system inspection circuit 82 is a circuit which has reciprocating lines forming pairs in the card edge connector 10. The reciprocating lines include outward lines connected to the contact terminals on the front surface side and return lines connected to the contact terminals on the back surface side. The signal system inspection circuit 82 is configured to determine presence or absence of a detection voltage on the return lines when a measurement voltage is applied to the outward lines.

The arithmetic control part 81A includes a microprocessor CPU, a program memory PMEM, and a data memory DMEM, and is configured to sequentially apply measurement voltage to the outward lines of the signal system inspection circuit 82 to monitor the presence or absence of the detection voltage on the return lines at the time of application of the measurement voltage.

Further, the arithmetic control part 81A is configured to simultaneously monitor generation of the detection voltage on an unexpected return line when the measurement voltage is applied to a certain outward line.

Further, when the lead wires 72a and 72b included in the wire harness 70 intersect each other in a complicated manner, the correction intersection parts 85a and 85b provided on the relay board 86A correct such complicated intersection on the relay board 86 and provides a state which is equivalent to a state in which a standard wire harness 70 without intersection is connected as viewed from the arithmetic control part 81A.

When the correction intersection parts 85a and 85b are not provided, and the lead wires connected to the mating connectors 71a, 71b, and 71c are directly input to the arithmetic control part 81A through intermediation of the signal system inspection circuit 82, wire numbers of wires connected to the program memory PMEM or the data memory DMEM are replaced, or, as described with reference to FIG. 3E later, replacement data serving as correction intersection units 85aa and 85bb are written into the data memory DMEM, thereby preventing changes in wiring at the correction intersection parts 85a and 85b.

Figure 2A:
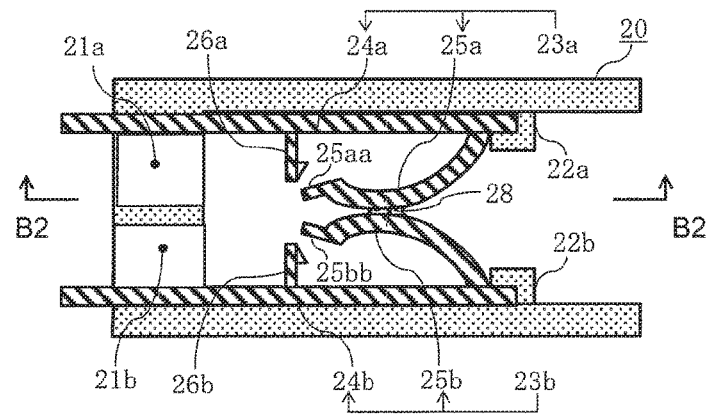
FIG. 2A is a sectional view of a card edge connector according to a second embodiment of the present invention.
Figure 2B:
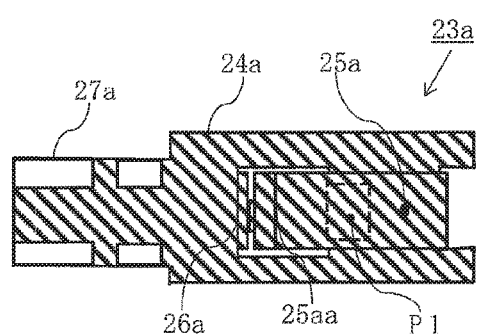
FIG. 2B is a partial plan view as viewed from a direction indicated by the arrows of the line B2-B2 of FIG. 2A.
Figure 2C:
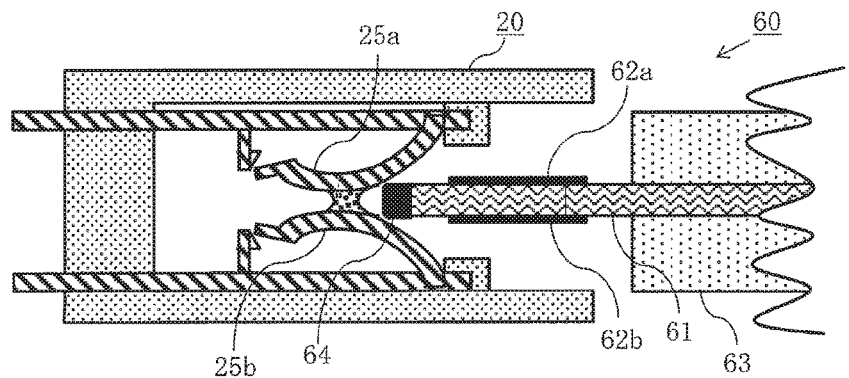
FIG. 2C is a sectional view for illustrating a state immediately before the control unit is inserted into the card edge connector of FIG. 2A.
Figure 2D:
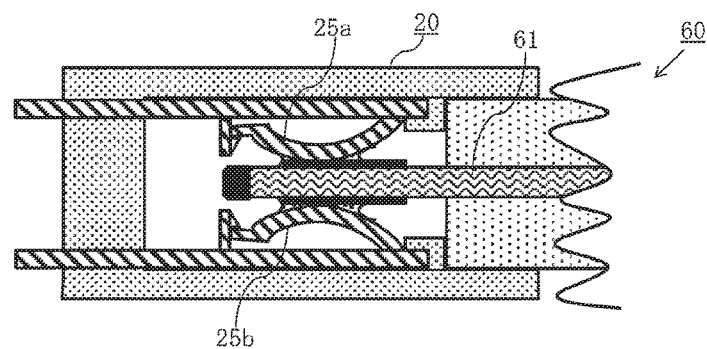
FIG. 2D is a sectional view for illustrating a state in which the control unit is completely inserted into the card edge connector of FIG. 2A.
Figure 2E:
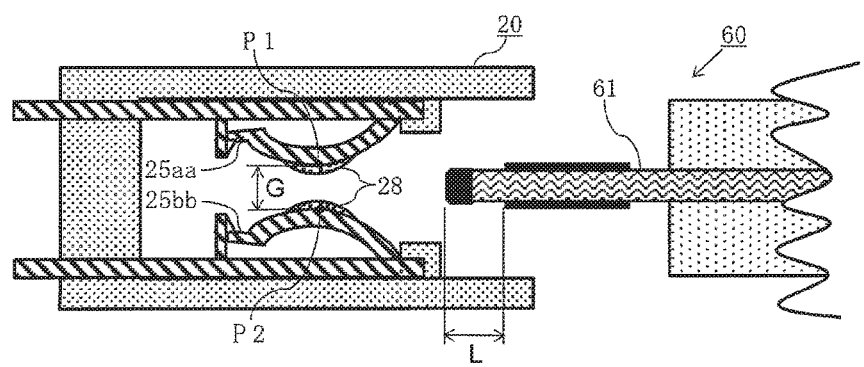
FIG. 2E is a sectional view for illustrating a state in which the control unit is completely removed from the card edge connector of FIG. 2A.

(2) Detailed Description of Configuration and Action of Card Edge Connector According to Second Embodiment Next, with reference to FIG. 2A being a sectional view for illustrating a card edge connector according to a second embodiment of the present invention, FIG. 2B being a partial plan view as viewed from a direction indicated by the arrows of the line B2-B2 of FIG. 2A, FIG. 2C being a sectional view for illustrating a state immediately before the control unit is inserted into the card edge connector of FIG. 2A, FIG. 2D being a sectional view for illustrating a state in which the control unit is completely inserted into the card edge connector of FIG. 2A, and FIG. 2E being a sectional view for illustrating a state in which the control unit is completely removed from the card edge connector of FIG. 2A, detailed description is made of a configuration and an action of the card edge connector according to the second embodiment with a main focus on a difference from the first embodiment.

In the second embodiment, the card edge connector of the first embodiment is partially changed. Specifically, elastic hooks 26a and 26b are added to back surface members 24a and 24b, and engagement portions 25aa and 25bb are added to movable members 25a and 25b. Reference symbols of corresponding parts are changed from the numbers of 10s to the numbers of 20s.

In FIG. 2A to FIG. 2C, a card edge connector 20 includes a plurality of front and back pairs of contact terminals 23a and 23b provided in a resin-molded connector housing. The contact terminals 23a and 23b are conductive members having elasticity, which are constructed by back surface members 24a and 24b and movable members 25a and 25b. The back surface members 24a and 24b have one ends to which the lead wires 72a and 72b (see FIG. 1B) are connected through intermediation of wire connection portions 27a. The movable members 25a and 25b are formed by folding back another ends of the back surface members 24a and 24b. The pair of movable members 25a and 25b are held in abutment against each other before the circuit board 61 is inserted, and are brought into conductive contact with each other by breaking through a film of a non-conductive lubricating material 28 applied to contact surfaces (see FIG. 2A).

At intermediate positions of the back surface members 24a and 24b, there are formed elastic hooks 26a and 26b drawn therefrom. The elastic hooks 26a and 26b are engageable with engagement portions 25aa and 25bb formed at distal end portions of the movable members 25a and 25b (see FIG. 2E).

Further, the plurality of pairs of contact terminals 23a and 23b, under a state in which the lead wires 72a and 72b are connected thereto, are inserted through insertion window holes 21a and 21b formed in the connector housing, respectively, and are held between the insertion window hole 21a and a stopper 22a and between the insertion window hole 21b and a stopper 22b, respectively.

The control unit 60 to be connected to the external equipment through intermediation of the card edge connector 20 is configured similarly to that of FIG. 1B, and on the control unit 60, there are provided the front and back pair of copper foil terminals 62a and 62b on both the surfaces at the end portion of the circuit board 61. The copper foil terminals 62a and 62b are connected to the circuit component (not shown) sealed with the integrally-molded resin 63. The end surface fixing member 64 is molded integrally with the end surface of the circuit board 61 (see FIG. 2C and FIG. 2E).

In FIG. 2D and FIG. 2E, when the circuit board 61 is inserted between the pair of movable members 25a and 25b, the distal end portions of the movable members 25a and 25b are separated with fold-back positions of the back surface members 24a and 24b being supporting points, and the conductive contact between the front and back pair of movable members 25a and 25b is released. When the circuit board 61 is further inserted, the front and back movable members 25a and 25b are brought into conductive contact with the surfaces of the front and back copper foil terminals 62a and 62b, respectively. Further, the elastic hooks 26a and 26b retreat so that the engagement portions 25aa and 25bb of the movable members 25a and 25b are placed on respective inner sides of the elastic hooks 26a and 26b (see FIG. 2D).

When the circuit board 61 is removed, the elastic hooks 26a and 26b are brought into engagement with the engagement portions 25aa and 25bb, thereby causing contact surface portions P1 and P2 of the movable members 25a and 25b to be opposed to each other with an initial gap G. The initial gap G has a dimension which is smaller than a thickness dimension of the circuit board 61 (see FIG. 2E).

When the circuit board 61 is inserted for the first time, and the contact surfaces portions P1 and P2 of the movable members 25a and 25b are separated from each other, a large stress is generated on the end surface fixing member 64. Along with increase in separation dimension, plastic deformation of the movable members 25a and 25b occur. As a result, the contact pressure caused by the abutment of the contact surface portions P1 and P2 against the copper foil terminals 62a and 62b is reduced. Accordingly, in cooperation with the effect of suppressing the abrasion resistance by the lubricating material 28, the slide abrasion of the copper foil terminals 62a and 62b is suppressed.

This action similarly applies to the case of inserting the circuit board 61 again. At the time of inserting the circuit board 61 again, the movable members 25a and 25b are separated by a dimension of a difference between the initial gap G, which is determined by positions of the elastic hooks 26a and 26b, and the thickness dimension of the circuit board 61, and the movable members 25a and 25b are already elastically deformed. Therefore, the contact pressure of the movable members 25a and 25b with respect to the copper foil terminals 62a and 62b is also reduced.

A conduction inspection device for the wire harness 70 with the card edge connector 20 according to the second embodiment is the same as the conduction inspection device described with reference to FIG. 1E.

(3) Summary and Features of First Embodiment and Second Embodiment

As apparent from the above-mentioned description, there is provided the card edge connector 10 or 20 according to the first embodiment of the present invention or the second embodiment being a modification embodiment thereof, which is mainly constructed by the connector housing formed of a resin-molded material to be removably fixed to the control unit 60 including the plurality of front and back pairs of copper foil terminals 62a and 62b provided on both the surfaces at the end portion of the circuit board 61, the card edge connector 10 or 20 integrally accommodating the plurality of front and back pairs of contact terminals 13a and 13b, or 23a and 23b to be brought into conductive contact with the plurality of pairs of copper foil terminals 62a and 62b, the card edge connector 10 or 20 being configured to be removably mounted to the control unit 60, in which the card edge connector 10 or 20 constructs the wire harness 70 including the lead wires 72a and 72b having one ends connected to the plurality of pairs of contact terminals 13a and 13b, or 23a and 23b and another ends connected to at least one mating connector 71a, 71b, or 71c, in which each of the plurality of pairs of contact terminals 13a and 13b, or 23a and 23b includes:

the front and back pair of back surface members 14a and 14b, or 24a and 24b having one ends connected to the lead wires 72a and 72b; and the front and back pair of movable members 15a and 15b, or 25a and 25b formed integrally with the pair of back surface members, in which the pair of movable members 15a and 15b, or 25a and 25b are held in conductive contact with each other until the circuit board 61 is inserted, in which, when the circuit board 61 is inserted, the conductive contact is released, and an elastic stress is reduced by plastic deformation of the pair of movable members 15a and 15b, or 25a and 25b, and the circuit board 61 is brought into conductive contact with the copper foil terminals 62a and 62b, in which, when the circuit board 61 is once inserted and then removed, the plastic deformation of the pair of movable members 15a and 15b, or 25a and 25b releases the conductive contact of the pair of movable members 15a and 15b, or 25a and 25b, and the pair of movable members 15a and 15b, or 25a and 25b are opposed to each other with an initial gap G having a dimension smaller than the thickness dimension of the circuit board 61, and in which, when the circuit board 61 is inserted again, the initial gap G is increased, and the pair of movable members 15a and 15b, or 25a and 25b are brought into conductive contact with the pair of copper foil terminals 62a and 62b.

There is provided the card edge connector, in which the front and back pair of contact surface portions P1 and P2 of the pair of contact terminals 13a and 13b, or 23a and 23b to be brought into contact with the pair of copper foil terminals 62a and 62b are arranged apart by a dimension equal to or more than the predetermined preliminary insertion dimension L from positions at which the end surfaces of the circuit board 61 are first brought into abutment against the movable members 15a and 15b, or 25a and 25b, in which the pair of contact terminals 13a and 13b, or 23a and 23b are conductive members having elasticity, which are constructed by the pair of back surface members 14a and 14b, or 24a and 24b and the pair of movable members 15a and 15b, or 25a and 25b, the pair of back surface members 14a and 14b, or 24a and 24b having one ends to which the one ends of the lead wires 72a and 72b are connected, the pair of movable members 15a and 15b, or 25a and 25b being formed by folding back the another ends of the pair of back surface members 14a and 14b, or 24a and 24b, in which the pair of movable members 15a and 15b, or 25a and 25b include the pair of contact surface portions P1 and P2 having folded end portions from the pair of back surface members 14a and 14b, or 24a and 24b being supporting points, and in which the pair of contact surface portions P1 and P2 are separated from the pair of back surface members 14a and 14b, or 24a and 24b in a relationship in which the front and back pair of contact surfaces are held in conductive contact with each other until the circuit board 61 is inserted, and an elastic property of the pair of contact terminals 13a and 13b, or 23a and 23b is set in a relationship that, when the circuit board 61 is inserted between the pair of contact surfaces P1 and P2 beyond the preliminary insertion dimension L, and then removed, folded support portions of the pair of movable members 15a and 15b, or 25a and 25b are plastically deformed, and the initial gap G equal to or less than the thickness dimension of the circuit board 61 is formed between the pair of contact surfaces.

As described above, in relation to claim 2 of the present invention, the movable members constructing the contact terminals of the card edge connector are formed by folding back the distal end portions of the back surface members, and the contact surface portions are provided at the distal end portions of the folded movable members.

Therefore, when the circuit board is inserted between the pair of movable members, the pair of movable members can be gradually separated. As a result, the circuit board is smoothly inserted, and abrasion powder is less liable to be formed.

There is provided the card edge connector, in which the pair of elastic hooks 26a and 26b are provided at the intermediate positions of the pair of back surface members 24a and 24b of the pair of contact terminals 23a and 23b, and the pair of engagement portions 25aa and 25bb to be brought into engagement with the pair of elastic hooks 26a and 26b are provided at the distal end positions of the pair of movable members 25a and 25b, in which, when the circuit board 61 is inserted between the pair of movable members 25a and 25b, the pair of movable members 25a and 25b are separated from each other, and the pair of elastic hooks 26a and 26b deform and retreat so that the pair of engagement portions 25aa and 25bb are brought into engagement with the pair of elastic hooks 26a and 26b, and in which, when the circuit board 61 is removed, the state of engagement of the pair of elastic hooks 26a and 26b with the pair of engagement portions 25aa and 25bb is maintained, and the pair of contact surface portions P1 and P2 are opposed to each other with the initial gap G.

As described above, in relation to claim 3 of the present invention, in the case of the second embodiment, when the circuit board is inserted between the pair of movable members, the pair of elastic hooks provided on the back surface members deform and retreat, and the pair of engagement portions provided on the movable members are brought into engagement with the elastic hooks. When the circuit board is removed, the state of engagement of the pair of elastic hooks with the pair of engagement portions is maintained, and the contact surface portions are opposed to each other with a gap dimension equal to or less than the thickness dimension of the circuit board.

Accordingly, the initial gap having a constant dimension is obtained. When the circuit board is inserted again, the slide abrasion of the conductive contact surfaces can be suppressed with the constant separation dimension which is determined by the difference between the thickness dimension of the circuit board including the front and back pair of copper foil terminals and the initial gap.

There is provided the card edge connector, in which the end surface fixing member 64 is provided at the end surface position of the circuit board 61 to be inserted between the pair of movable members 15a and 15b, or 25a and 25b, and in which the end surface fixing member 64 and the plurality of pairs of copper foil terminals 62a and 62b are arranged at coordinate positions with common reference holes formed in the circuit board 61 being reference points.

As described above, in relation to claim 6 of the present invention, the end surface fixing member is provided at the end surface position of the circuit board. The end surface fixing member and the plurality of pairs of copper foil terminals are provided at respective coordinate positions with the common reference holes formed in the circuit board being reference points.

Accordingly, until the distal end portion of the circuit board is brought into abutment against the pair of movable members, and the movable members are completely separated, a constant preliminary insertion dimension is provided, thereby being capable of preventing application of excessive contact pressure on the copper foil terminals.

This action similarly applies to the cases of movable members 35a and 35b of a third embodiment of the present invention and movable members 45a and 45b of a fourth embodiment of the present invention.

There is provided the card edge connector, in which the pair of movable members 15a and 15b, or 25a and 25b include the pair of contact surface portions P1 and P2 with one of the folded end portions or push-out end portions from the pair of back surface members 24a and 24b being supporting points, in which the pair of contact surface portions P1 and P2 construct arc-shaped curved surfaces with respect to a direction of removing the circuit board 61, and the non-conductive lubricating material 18 or 28 is applied to the pair of contact surface portions P1 and P2, and in which rust-proof surface treatment represented by gold plating is applied to the pair of copper foil terminals 62a and 62b.

As described above, in relation to claim 7 of the present invention, the non-conductive lubricating material is applied to the contact surface portions of the pair of movable members, and rust-proof surface treatment such as gold plating is applied to the pair of copper foil terminals.

Accordingly, the friction coefficient between the contact surface portions of the movable members and the copper foil terminals is reduced, thereby being capable of suppressing damage and degradation of the copper foil terminals due to the slide friction.

Further, the movable members have arc-shaped contact surfaces with respect to the copper foil terminals, and are brought into contact with the copper foil terminals at a certain contact angle. Further, the separation dimension of the slide surface portions at the time of insertion of the circuit board beyond the preliminary insertion dimension is obtained by subtracting the initial gap dimension of the slide surface portions from the thickness dimension of the circuit board. Therefore, the slide distance between the slide surface portions of the movable members and the copper foil terminals, which is determined by the separation dimension of the slide surface portions and the inclination angle of the slide surface portions, is significantly reduced, thereby being capable of further suppressing damage and degradation of the copper foil terminals due to the slide friction.

This action similarly applies to the cases of the movable members 35a and 35b of the third embodiment and the movable members 45a and 45b of the fourth embodiment.

There is provided the card edge connector, in which, one pair of copper foil terminals of the plurality of pairs of copper foil terminals 62a and 62b arranged on the circuit board 61 are used as positive-side power supply terminals on both front and back, and another pair of copper foil terminals are used as negative-side power supply terminals on front and back, or at least the positive-side power supply terminals and the negative-side power supply terminals are arranged on one of front surface terminals or back surface terminals of the copper foil terminals 62a and 62b of a different pair.

As described above, in relation to claim 8 of the present invention, the positive-side power supply terminal and the negative-side power supply terminal are prevented from being arranged on front and back of the same pair of copper foil terminals.

Accordingly, when power supply is erroneously applied to a wire harness to which the circuit board is not inserted, occurrence of the power supply short circuit in the pair of contact terminals is prevented.

Further, it is preferred that the positive-side power supply terminals and the negative-side power supply terminals use respective front and back terminals of pairs of copper foil terminals.

In this case, no actual harm is caused by erroneous wiring of the front and back of the wire harness.

This feature similarly applies to the cases of the third embodiment and the fourth embodiment.

There is provided the card edge connector, in which the contact terminal 13a or 23a on the front side of the pair of contact terminals 13a and 13b, or 23a and 23b to be brought into contact with the copper foil terminal 62a on the front surface side of the pair of copper foil terminals 62a and 62b of the circuit board 61 and the contact terminal 13b or 23b on the back side of the pair of contact terminals 13a and 13b, or 23a and 23b to be brought into contact with the copper foil terminal 62b on the back surface side of the pair of copper foil terminals 62a and 62b have non-symmetrical members having mirrored structures on front and back, and are configured to prevent erroneous insertion on front and back with respect to the connector housing constructing the card edge connector 10 or 20, and in which the lead wire 72a on the front surface side to be connected to the contact terminal 13a or 23b on the front surface side has a first feature in common color tone, and the lead wire 72b on the back surface side to be connected to the contact terminal 13b or 23b on the back surface side has a second feature in common color tone, and the first feature and the second feature are visually distinguished.

As describe above, in relation to claim 9 of the present invention, the contact terminal on the front surface side to be brought into contact with the copper foil terminal on the front surface side and the contact terminal on the back side to be brought into contact with the copper foil terminal on the back surface side have mirrored structures, and there are used the lead wires on the front surface side and the lead wires on the back surfaces side which are different in color tones.

Therefore, occurrence of erroneous wiring of the front and back pair of the contact terminals on the card edge connector side can be prevented, and caution can be given to prevent erroneous connection of the lead wires with respect to the mating connectors.

This feature similarly applies to contact terminals 33a and 33b of the card edge connector 30 according to the third embodiment and contact terminals 43a and 43b of a card edge connector 40 according to the fourth embodiment.

Figure 3A:
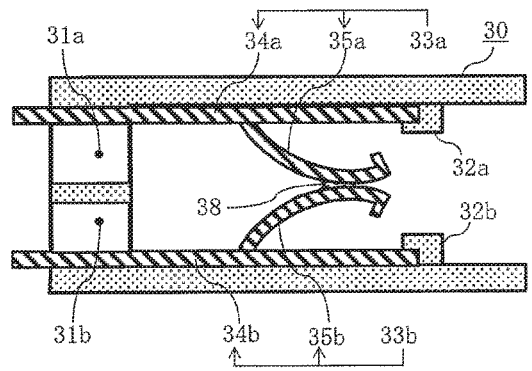
FIG. 3A is a sectional view of a card edge connector according to a third embodiment of the present invention.
Figure 3B:
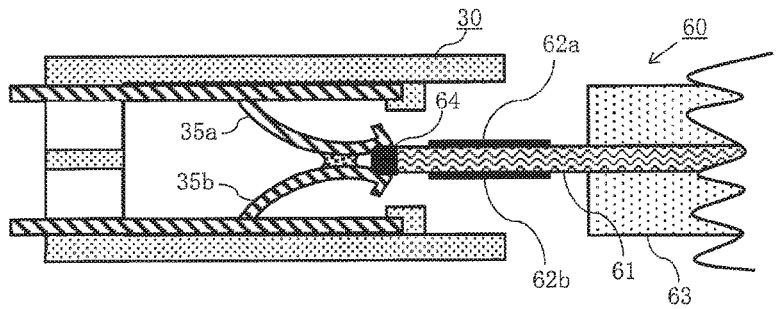
FIG. 3B is a sectional view for illustrating a state immediately before the control unit is inserted into the card edge connector of FIG. 3A.
Figure 3C:
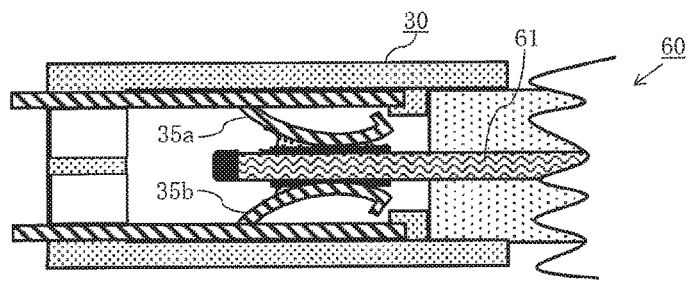
FIG. 3C is a sectional view for illustrating a state in which the control unit is completely inserted into the card edge connector of FIG. 3A.
Figure 3D:
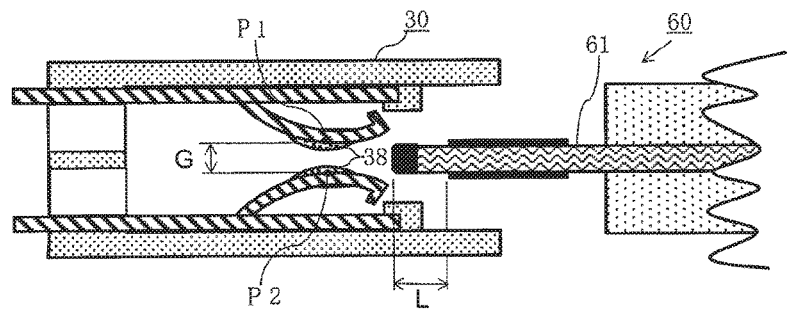
FIG. 3D is a sectional view for illustrating a state in which the control unit is completely removed from the card edge connector of FIG. 3A.

Third Embodiment and Fourth Embodiment (1) Detailed Description of Configuration and Action of Card Edge Connector According to Third Embodiment Next, with reference to FIG. 3A being a sectional view for illustrating a card edge connector according to the third embodiment of the present invention, FIG. 3B being a sectional view for illustrating a state immediately before a control unit is inserted into the card edge connector of FIG. 3A, FIG. 3C being a sectional view for illustrating a state in which the control unit is completely inserted into the card edge connector of FIG. 3A, and FIG. 3D being a sectional view for illustrating a state in which the control unit is completely removed from the card edge connector of FIG. 3A, detailed description is made of a configuration and an action of the card edge connector according to the third embodiment.

In the third embodiment, the card edge connector of the third embodiment is partially changed. Specifically, the mounting positions and directions of movable members are changed. Reference symbols of corresponding parts are changed from the numbers of 10s to the numbers of 30s.

In FIG. 3A and FIG. 3B, the card edge connector 30 includes the plurality of front and back pairs of contact terminals 33a and 33b provided in the resin-molded connector housing. The contact terminals 33a and 33b are conductive members having elasticity, which are constructed by back surface members 34a and 34b and the movable members 35a and 35b. The back surface members 34a and 34b have one ends to which the lead wires 72a and 72b (see FIG. 3B) are connected through intermediation of wire connection portions. The movable members 35a and 35b are formed by folding back another ends of the back surface members 34a and 34b. The pair of movable members 35a and 35b are held in abutment against each other before the circuit board 61 is inserted, and are brought into conductive contact with each other by breaking through a film of a non-conductive lubricating material 38 applied to contact surfaces (see FIG. 3A).

The plurality of pairs of contact terminals 33a and 33b, under a state in which the lead wires 72a and 72b are connected thereto, are inserted through insertion window holes 31a and 31b formed in the connector housing, respectively, and are held between the insertion window hole 31a and a stopper 32a and between the insertion window hole 31b and a stopper 32b, respectively.

Similarly to the first embodiment, the lubricating material 38 is commercially available as a contact oil, and may be of a conductive type or a non-conductive type. In the embodiments, the lubricating material 38 of the non-conductive type is used to prevent leakage of electricity between contact terminals provided adjacent to each other.

Meanwhile, similarly to the first embodiment, on the control unit 60 to be connected to the external equipment through intermediation of the card edge connector 30, there are provided the front and back pair of copper foil terminals 62a and 62b on both the surfaces at an end portion of the circuit board 61. The copper foil terminals 62a and 62b are connected to the circuit component (not shown) sealed with the integrally-molded resin 63. The end surface fixing member 64 is molded integrally with the end surface of the circuit board 61 (see FIG. 3B and FIG. 3D).

The reference holes (not shown) are formed at the diagonal positions in the circuit board 61. The forming positions of the copper foil terminals 62a and 62b and the end surface position of the end surface fixing member 64 are set through use of the reference holes as common reference points. The relative positions of the copper foil terminals 62a and 62b with respect to the end surface of the end surface fixing member 64 are set so that the preliminary insertion dimension L, which is constant without unevenness, can be obtained even when the end surface position of the circuit board 61 is less accurate.

In FIG. 3C and FIG. 3D, when the circuit board 61 is inserted between the pair of movable members 35a and 35b, distal end portions of the movable members 35a and 35b are separated with push-out positions of the back surface members 34a and 34b being supporting points, and the conductive contact between the front and back pair of movable members 35a and 35b is released. When the circuit board 61 is further inserted, the front and back movable members 35a and 35b are brought into conductive contact with the surfaces of the front and back copper foil terminals 62a and 62b, respectively (see FIG. 3C).

When the circuit board 61 is removed, plastic deformation of the movable members 35a and 35b causes the contact surface portions P1 and P2 to be opposed to each other with the initial gap G. The initial gap G has a dimension which is smaller than the thickness dimension of the circuit board 61 (see FIG. 3D).

Therefore, when the circuit board 61 is inserted for the first time, and the contact surfaces portions P1 and P2 of the movable members 35a and 35b are separated from each other, a large stress is generated on the end surface fixing member 64. Along with increase in separation dimension, plastic deformation of the movable members 35a and 35b occur. As a result, the contact pressure caused by the abutment of the contact surface portions P1 and P2 against the copper foil terminals 62a and 62b is reduced. Accordingly, in cooperation with the effect of suppressing the abrasion resistance by the lubricating material 38, the slide abrasion of the copper foil terminals 62a and 62b is suppressed.

This action similarly applies to the case of inserting the circuit board 61 again. At the time of inserting the circuit board 61 again, the movable members 35a and 35b are already plastically deformed. The movable members 35a and 35b are separated by the dimension of the difference between the initial gap G and the thickness dimension of the circuit board 61. The contact pressure of the movable members 35a and 35b with respect to the copper foil terminals 62a and 62b is also reduced.

Figure 3E:
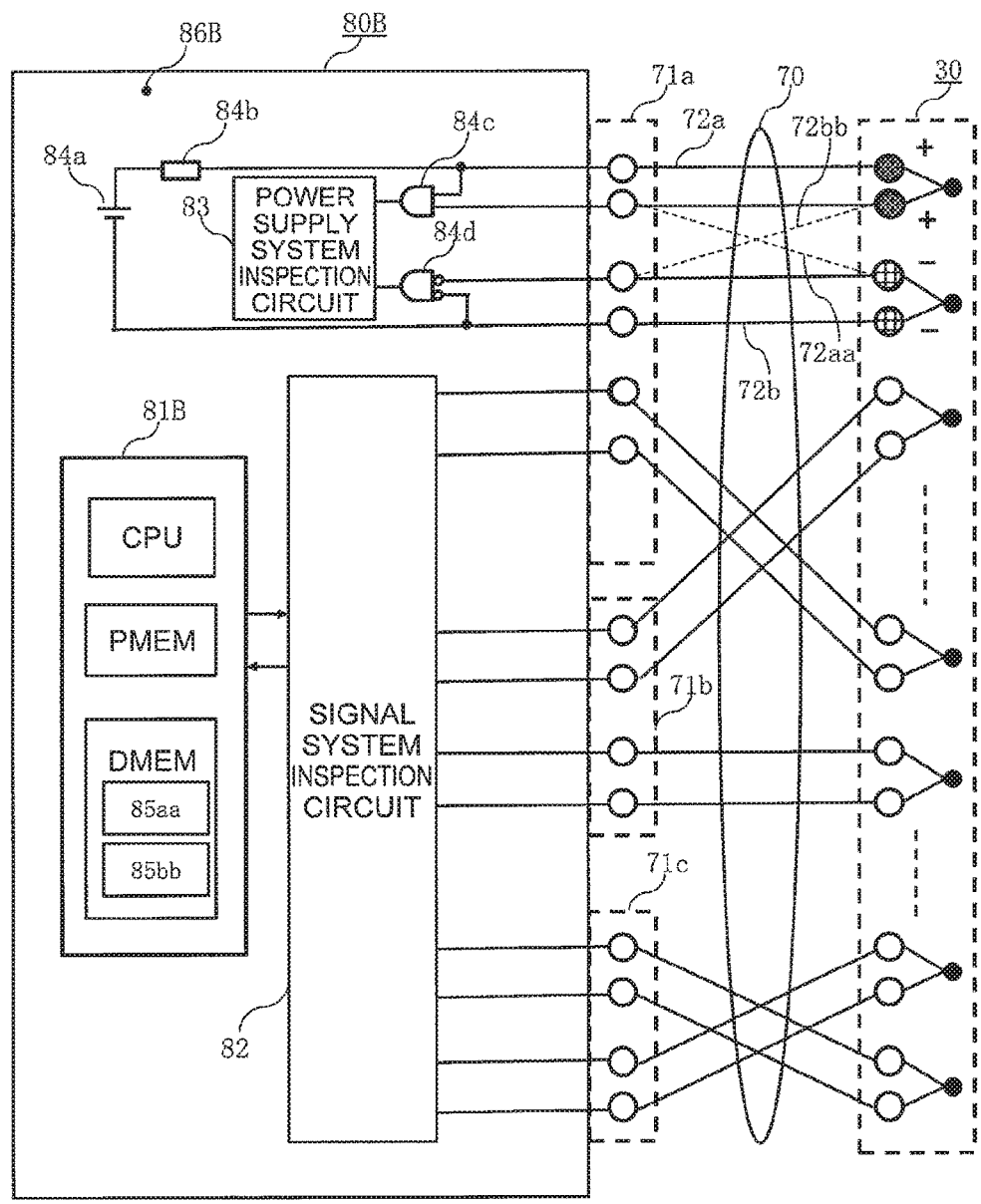
FIG. 3E is an overall configuration view of a conduction inspection device of a second mode for the card edge connector of FIG. 3A.

Next, with reference to FIG. 3E being an overall configuration view of a conduction inspection device of a second mode for the card edge connector of FIG. 3A, detailed description is made of a configuration and an action of the conduction inspection device with a main focus on a difference from the conduction inspection device of FIG. 1E.

In FIG. 3E, the lead wires 72a and 72b have one ends connected to the contact terminals 33a and 33b of the card edge connector 30 and another ends connected to the first terminals of the mating connectors 71a, 71b, and 71c, thereby constructing the wire harness 70.

The second terminals fitted to the first terminals of the mating connectors 71a, 71b, and 71c are provided on a relay board 86B constructing a conduction inspection device 80B.

With this structure, the wire harness 70 is removably connected to the relay board 86B.

In this embodiment, the pair of contact terminals illustrated at an uppermost stage of the card edge connector 30 are used as positive-side power supply terminals. The pair of contact terminals illustrated at the next stage are used as negative-side power supply terminals. The pairs of contact terminals construct a power supply system circuit, and are connected to the relay board 86B through intermediation of the mating connector 71a.

Other contact terminals of the card edge connector 30 construct a signal system circuit, and are connected to the relay board 86B through intermediation of the mating connectors 71a, 71b, and 71c.

On the relay board 86B, there are provided an arithmetic control part 81B, the signal system inspection circuit 82, and the power supply system inspection circuit 83.

The configuration and the action of the power supply system inspection circuit 83, which includes the control power supply 84a, the current-limiting resistor 84b, the logical product circuit 84c, and the negative input logical product circuit 84d provided on the relay board 86B, are the same as those described with reference to FIG. 1E. The power supply system inspection circuit 83 is configured to determine that the power supply system circuit is normal when the output logic of the logical product circuit 84c and the output logic of the negative input logical product circuit 84d are both "H".

However, when the connection terminal on the back surface side of the front and back pair of connection terminals being the positive-side power supply terminals and the connection terminal on the front surface side of the pair of connection terminals being the negative-side power supply terminals cross each other by the erroneous wirings 72aa and 72bb illustrated with the dotted lines, the output logic of the logical product circuit 84c and the output logic of the negative input logical product circuit 84d are both at the logic level of "L", and the power supply system inspection circuit 83 determines that the power supply system circuit is abnormal.

When the wires on the front and back sides of the front and back pairs of connection terminals cross each other, erroneous wiring cannot be detected. However, when both of the front and back pair of connection terminals are the positive-side power supply terminals or the negative-side power supply terminals, there is no actual harm.

Similarly in FIG. 1E, the signal system inspection circuit 82 is a circuit which has reciprocating lines forming pairs in the card edge connector 30. The reciprocating lines include outward lines connected to the contact terminals on the front surface side and return lines connected to the contact terminals on the back surface side. The signal system inspection circuit 82 is configured to determine presence or absence of a detection voltage on the return lines when a measurement voltage is applied to the outward lines.

The arithmetic control part 81B includes a microprocessor CPU, a program memory PMEM, and a data memory DMEM, and is configured to sequentially apply measurement voltage to the outward lines of the signal system inspection circuit 82 to monitor the presence or absence of the detection voltage on the return lines at the time of application of the measurement voltage.

Further, the arithmetic control part 81A is configured to simultaneously monitor generation of the detection voltage on an unexpected return line when the measurement voltage is applied to a certain outward line.

When there is irregular intersection wiring in the lead wires connecting the card edge connector 30 to the mating connectors 71a, 71b, and 71c, the correction intersection units 85aa and 85bb stored in the data memory DMEM are provided. Through replacement of the wiring numbers by the correction intersection units 85aa and 85bb, the presence or absence of abnormality in wiring can be determined with a standard program which is used in a case where the intersecting wiring is not present.

Figure 4A:
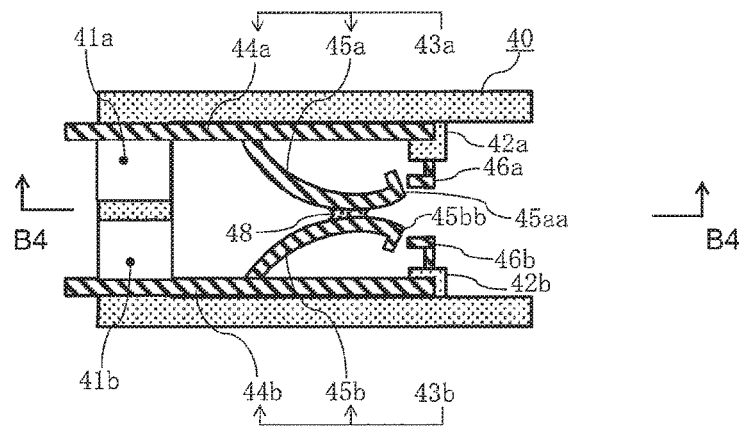
FIG. 4A is a sectional view of a card edge connector according to a fourth embodiment of the present invention.
Figure 4B:
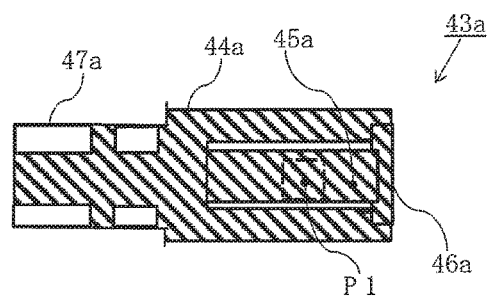
FIG. 4B is a partial plan view as viewed from a direction of the arrows of the line B4-B4 of FIG. 4A.
Figure 4C:
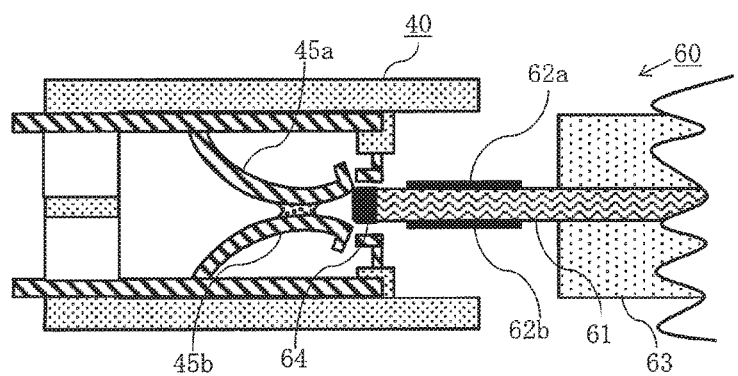
FIG. 4C is a sectional view for illustrating a state immediately before the control unit is inserted into the card edge connector of FIG. 4A.
Figure 4D:
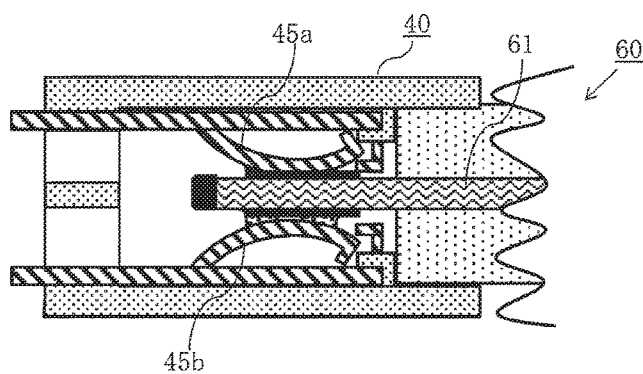
FIG. 4D is a sectional view for illustrating a state in which the control unit is completely inserted into the card edge connector of FIG. 4A.
Figure 4E:
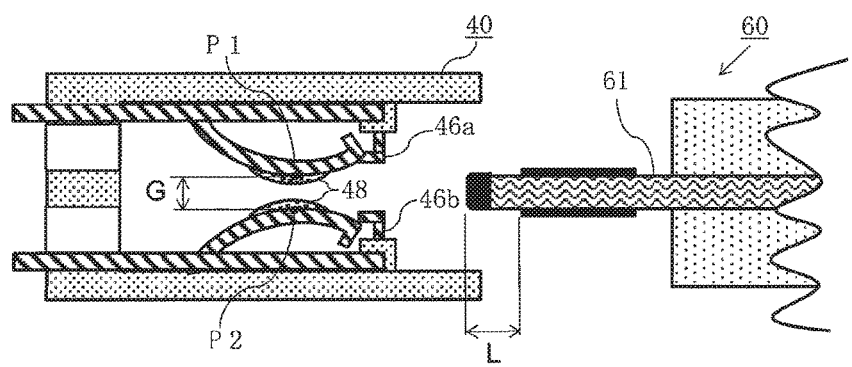
FIG. 4E is a sectional view for illustrating a state in which the control unit is completely removed from the card edge connector of FIG. 4A.
Figure 5C:
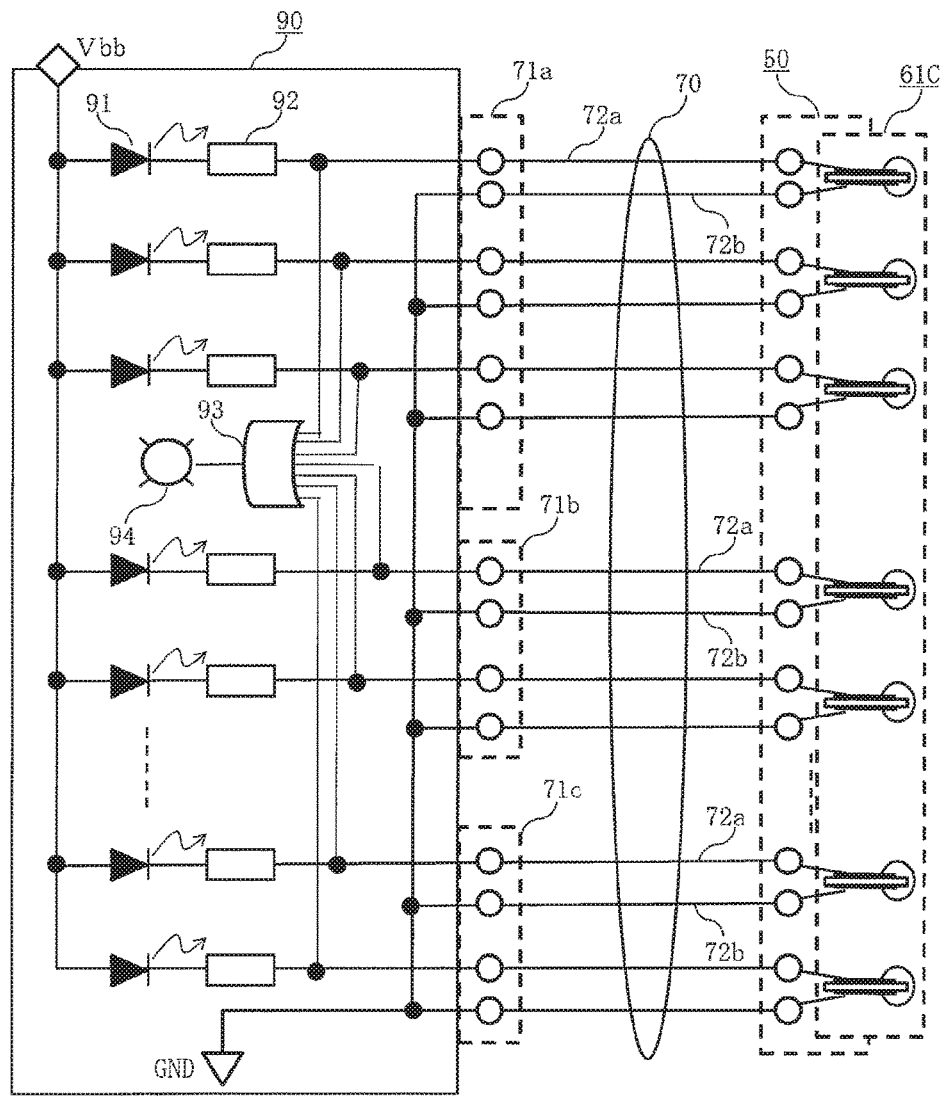
FIG. 5C is an overall configuration view of a conduction inspection device according to a generally known mode for the card edge connector of FIG. 5A.

(2) Detailed Description of Configuration and Action of Card Edge Connector According to Fourth Embodiment Next, with reference to FIG. 4A being a sectional view for illustrating a card edge connector according to the fourth embodiment of the present invention, FIG. 4B being a partial plan view as viewed from a direction indicated by the arrows of the line B4-B4 of FIG. 4A, FIG. 4C being a sectional view for illustrating a state immediately before the control unit is inserted into the card edge connector of FIG. 4A, FIG. 4D being a sectional view for illustrating a state in which the control unit is completely inserted into the card edge connector of FIG. 4A, and FIG. 4E being a sectional view for illustrating a state in which the control unit is completely removed from the card edge connector of FIG. 4A, detailed description is made of a configuration and an action of the card edge connector according to the fourth embodiment with a main focus on a difference from the third embodiment.

In the fourth embodiment, the card edge connector of the third embodiment is partially changed. Specifically, elastic hooks 46a and 46b are added to back surface members 44a and 44b, and engagement portions 45aa and 45bb are added to the movable members 45a and 45b. Reference symbols of corresponding parts are changed from the numbers of 30s to the numbers of 40s.

In FIG. 4A to FIG. 4C, the card edge connector 40 includes the plurality of front and back pairs of contact terminals 43a and 43b provided in the resin-molded connector housing. The contact terminals 43a and 43b are conductive members having elasticity, which are constructed by the back surface members 44a and 44b and the movable members 45a and 45b. The back surface members 44a and 44b have one ends to which the lead wires 72a and 72b (see FIG. 4B) are connected through intermediation of wire connection portions 47a. The movable members 45a and 45b are formed by being pushed out intermediate positions of the back surface members 44a and 44b. The pair of movable members 45a and 45b are held in abutment against each other before the circuit board 61 is inserted, and are brought into conductive contact with each other by breaking through a film of a non-conductive lubricating material 48 applied to contact surfaces (see FIG. 4C).

At distal end positions of the back surface members 44a and 44b, there are formed the elastic hooks 46a and 46b folded therefrom. The elastic hooks 46a and 46b are engageable with the engagement portions 45aa and 45bb formed at distal end portions of the movable members 45a and 45b (see FIG. 4A and FIG. 4E).

Further, the plurality of pairs of contact terminals 43a and 43b, under a state in which the lead wires 72a and 72b are connected thereto, are inserted through insertion window holes 41a and 41b formed in the connector housing, respectively, and are held between the insertion window hole 41a and a stopper 42a and between the insertion window hole 41b and a stopper 42b, respectively.

The control unit 60 is configured similarly to that in FIG. 3B. On the control unit 60 to be connected to the external equipment through intermediation of the card edge connector 40, there are provided the front and back pair of copper foil terminals 62a and 62b on both surfaces at the end portion of the circuit board 61. The copper foil terminals 62a and 62b are connected to the circuit component (not shown) sealed with the integrally-molded resin 63. The end surface fixing member 64 is molded integrally with the end surface of the circuit board 61 (see FIG. 4C and FIG. 4E).

In FIG. 4D and FIG. 4E, when the circuit board 61 is inserted between the pair of movable members 45a and 45b, the distal end portions of the movable members 45a and 45b are separated with the intermediate positions of the back surface members 44a and 44b being supporting points, and the conductive contact between the front and back pair of movable members 45a and 45b is released. When the circuit board 61 is further inserted, the front and back movable members 45a and 45b are brought into conductive contact with the surfaces of the front and back copper foil terminals 62a and 62b, respectively. Further, the elastic hooks 46a and 46b retreat so that the engagement portions 45aa and 45bb of the movable members 45a and 45b are placed on respective inner sides of the elastic hooks 46a and 46b (see FIG. 4D).

When the circuit board 61 is removed, the elastic hooks 46a and 46b are brought into engagement with the engagement portions 45aa and 45bb, thereby causing the contact surface portions P1 and P2 of the movable members 45a and 45b to be opposed to each other with the initial gap G. The initial gap G has a dimension which is smaller than the thickness dimension of the circuit board 61 (see FIG. 4E).

Therefor, when the circuit board 61 is inserted for the first time, and the contact surfaces portions P1 and P2 of the movable members 45a and 45b are separated from each other, a large stress is generated on the end surface fixing member 64. Along with increase in separation dimension, plastic deformation of the movable members 45a and 45b occur. As a result, the contact pressure caused by the abutment of the contact surface portions P1 and P2 against the copper foil terminals 62a and 62b is reduced. Accordingly, in cooperation with the effect of suppressing the abrasion resistance by the lubricating material 48, the slide abrasion of the copper foil terminals 62a and 62b is suppressed.

This action similarly applies to the case of inserting the circuit board 61 again. At the time of inserting the circuit board 61 again, the movable members 45a and 45b are separated by the dimension of the difference between the initial gap G, which is determined by positions of the elastic hooks 46a and 46b, and the thickness dimension of the circuit board 61, and the movable members 45a and 45b are already elastically deformed. Therefore, the contact pressure of the movable members 45a and 45b with respect to the copper foil terminals 62a and 62b is also reduced.

A conduction inspection device for the wire harness 70 with the card edge connector 40 according to the fourth embodiment is the same as the conduction inspection device described with reference to FIG. 3E.

(3) Summary and Features of Third Embodiment and Fourth Embodiment

As apparent from the above-mentioned description, there is provided the card edge connector 30 or 40 according to the third embodiment of the present invention or the forth embodiment being a modification embodiment thereof, which is mainly constructed by the connector housing formed of a resin-molded material to be removably fixed to the control unit 60 including the plurality of front and back pairs of copper foil terminals 62a and 62b provided on both the surfaces at the end portion of the circuit board 61, the card edge connector 30 or 40 integrally accommodating the plurality of front and back pairs of contact terminals 33a and 33b, or 43a and 43b to be brought into conductive contact with the plurality of pairs of copper foil terminals 62a and 62b, the card edge connector 30 or 40 being configured to be removably mounted to the control unit 60, in which the card edge connector 30 or 40 constructs the wire harness 70 including the lead wires 72a and 72b having one ends connected to the plurality of pairs of contact terminals 33a and 33b, or 43a and 43b and another ends connected to at least one mating connector 71a, 71b, or 71c, in which each of the plurality of pairs of contact terminals 33a and 33b, or 43a and 43b includes:

the front and back pair of back surface members 34a and 34b, or 44a and 44b having one ends connected to the lead wires 72a and 72b; and the front and back pair of movable members 35a and 35b, or 45a and 45b formed integrally with the pair of back surface members 34a and 34b, or 44a and 44b, in which the pair of movable members 35a and 35b, or 45a and 45b are held in conductive contact with each other until the circuit board 61 is inserted, in which, when the circuit board 61 is inserted, the conductive contact is released, and an elastic stress is reduced by plastic deformation of the pair of movable members 35a and 35b, or 45a and 45b, and the circuit board 61 is brought into conductive contact with the plurality of pairs of copper foil terminals 62a and 62b, in which, when the circuit board 61 is once inserted and then removed, the plastic deformation of the pair of movable members 35a and 35b, or 45a and 45b releases the conductive contact of the pair of movable members 35a and 35b, or 45a and 45b, and the pair of movable members 35a and 35b, or 45a and 45b are opposed to each other with the initial gap G having a dimension smaller than the thickness dimension of the circuit board 61, and in which, when the circuit board 61 is inserted again, the initial gap is G increased, and the pair of movable members 35a and 35b, or 45a and 45b are brought into conductive contact with the pair of copper foil terminals 62a and 62b.

There is provided the card edge, in which the front and back pair of contact surface portions P1 and P2 of the pair of contact terminals 33a and 33b, or 43a and 43b to be brought into contact with the pair of copper foil terminals 62a and 62b are arranged apart by a dimension equal to or more than the predetermined preliminary insertion dimension L from positions at which the end surfaces of the circuit board 61 are first brought into abutment against the movable members 35a and 35b, or 45a and 45b, in which the pair of contact terminals 34a and 34b, or 44a and 44b are conductive members having elasticity, which are constructed by the pair of back surface members 34a and 34b, or 44a and 44b and the pair of movable members 35a and 35b, or 45a and 45b, the pair of back surface members 34a and 34b, or 44a and 44b having one ends to which the one ends of the lead wires 72a and 72b are connected, the pair of movable members 35a and 35b, or 45a and 45b being formed by folding back the another ends of the pair of back surface members 34a and 34b, or 44a and 44b, in which the pair of movable members 35a and 35b, or 45a and 45b include the pair of contact surface portions P1 and P2 having the folded end portions from the pair of back surface members 34a and 34b, or 44a and 44b being supporting points, and in which the pair of contact surface portions P1 and P2 are separated from the pair of back surface members 34a and 34b, or 44a and 44b in a relationship in which the front and back pair of contact surfaces P1 and P2 are held in conductive contact with each other until the circuit board 61 is inserted, and an elastic property of the pair of contact terminals 33a and 33b, or 43a and 43b is set in a relationship that, when the circuit board 61 is inserted between the pair of contact surfaces P1 and P2 beyond the preliminary insertion dimension L, and then removed, folded support portions of the pair of movable members 35a and 35b, or 45a and 45b are plastically deformed, and the initial gap G equal to or less than the thickness dimension of the circuit board 61 is formed between the pair of contact surfaces.

As described above, in relation to claim 4 of the present invention, the movable members constructing the contact terminals of the card edge connector are formed by being pushed out from the intermediate portions of the back surface members, and the contact surface portions are provided at the distal end portions of the push-out movable members.

Therefore, as compared to the case where the movable members are formed by folding back the distal end portions of the back surface members, the entire extension length of the contact terminals can be reduced, thereby being capable of reducing consumption of the conductive material.

There is provided the card edge connector, in which the pair of elastic hooks 46a and 46b are provided the intermediate positions of the pair of back surface members 34a and 34b, or 44a and 44b of the pair of contact terminals 33a and 33b, or 43a and 43b, and the pair of engagement portions 45aa and 45bb to be brought into engagement with the pair of elastic hooks 46a and 46b are provided at the distal end positions of the pair of movable members 35a and 35b, or 45a and 45b, in which, when the circuit board 61 is inserted between the pair of movable members 35a and 35b, or 45a and 45b, the pair of movable members 35a and 35b, or 45a and 45b are separated from each other, and the pair of elastic hooks 46a and 46b deform and retreat so that the pair of engagement portions 45aa and 45bb are brought into engagement with the pair of elastic hooks 46a and 46b, and in which, when the circuit board 61 is removed, the state of engagement of the pair of elastic hooks 46a and 46b with the pair of engagement portions 45aa and 45bb is maintained, and the pair of contact surface portions P1 and P2 are opposed to each other with the initial gap G.

As described above, in relation to claim 5 of the present invention, when the circuit board is inserted between the pair of movable members, the pair of elastic hooks provided on the back surface members deform and retreat, and the pair of engagement portions provided on the movable members are brought into engagement with the elastic hooks. When the circuit board is removed, the state of engagement of the pair of elastic hooks with the pair of engagement portions is maintained, and the contact surface portions are opposed to each other with a gap dimension equal to or less than the thickness dimension of the circuit board.

Accordingly, the initial gap having a constant dimension is obtained. When the circuit board is inserted again, the slide abrasion of the conductive contact surfaces can be suppressed with the constant separation dimension which is determined by the difference between the thickness dimension of the circuit board including the front and back pair of copper foil terminals and the initial gap.

What is claimed is:

1. A card edge connector, which is mainly constructed by a connector housing formed of a resin-molded material to be removably fixed to a control unit including a plurality of front and back pairs of copper foil terminals provided on both surfaces at an end portion of a circuit board, the card edge connector integrally accommodating a plurality of front and back pairs of contact terminals to be brought into conductive contact with the plurality of pairs of copper foil terminals, the card edge connector being configured to be removably mounted to the control unit, wherein the card edge connector constructs a wire harness including lead wires having one ends connected to the plurality of pairs of contact terminals and another ends connected to at least one mating connector, wherein each of the plurality of pairs of contact terminals comprises:
 a front and back pair of back surface members having one ends connected to the lead wires; and
 a front and back pair of movable members formed integrally with the pair of back surface members, wherein the pair of movable members are held in conductive contact with each other until the circuit board is inserted, wherein, when the circuit board is inserted, the conductive contact is released, and an elastic stress is reduced by plastic deformation of the pair of movable members, and the circuit board is brought into conductive contact with the plurality of pairs of copper foil terminals, wherein, when the circuit board is once inserted and then removed, the plastic deformation of the pair of movable members releases the conductive contact of the pair of movable members, and the pair of movable members are opposed to each other with an initial gap having a dimension smaller than a thickness dimension of the circuit board, and wherein, when the circuit board is inserted again, the initial gap is increased, and the pair of movable members are brought into conductive contact with the pair of copper foil terminals.

2. The card edge connector according to claim 1, wherein a front and back pair of contact surface portions of the pair of contact terminals to be brought into contact with the pair of copper foil terminals are arranged apart by a dimension equal to or more than a predetermined preliminary insertion dimension from positions at which the end surfaces of the circuit board are first brought into abutment against the movable members, wherein the pair of contact terminals are conductive members having elasticity, which are constructed by the pair of back surface members and the pair of movable members, the pair of back surface members having one ends to which the one ends of the lead wires are connected, the pair of movable members being formed by folding back the another ends of the pair of back surface members, wherein the pair of movable members include the pair of contact surface portions having folded end portions from the pair of back surface members being supporting points, and wherein the pair of contact surface portions are separated from the pair of back surface members in a relationship in which the front and back pair of contact surfaces are held in conductive contact with each other until the circuit board is inserted, and an elastic property of the pair of contact terminals is set in a relationship that, when the circuit board is inserted between the pair of contact surfaces beyond the preliminary insertion dimension, and then removed, folded support portions of the pair of movable members are plastically deformed, and the initial gap equal to or less than the thickness dimension of the circuit board is formed between the pair of contact surfaces.

3. The card edge connector according to claim 2,
wherein a pair of elastic hooks are provided at intermediate positions of the pair of back surface members of the pair of contact terminals, and a pair of engagement portions to be brought into engagement with the pair of elastic hooks are provided at distal end positions of the pair of movable members,
wherein, when the circuit board is inserted between the pair of movable members, the pair of movable members are separated from each other, and the pair of elastic hooks deform and retreat so that the pair of engagement portions are brought into engagement with the pair of elastic hooks, and
wherein, when the circuit board is removed, the state of engagement of the pair of elastic hooks with the pair of engagement portions is maintained, and the pair of contact surface portions are opposed to each other with the initial gap.

4. The card edge connector according to claim 1,
wherein a front and back pair of contact surface portions of the pair of contact terminals to be brought into contact with the pair of copper foil terminals are arranged apart by a dimension equal to or more than a predetermined preliminary insertion dimension from positions at which the end surfaces of the circuit board are first brought into abutment against the movable members,
wherein the pair of contact terminals are conductive members having elasticity, which are constructed by the pair of back surface members and the pair of movable members, the pair of back surface members having one ends to which the one ends of the lead wires are connected, the pair of movable members being formed by being pushed out from intermediate positions of the pair of back surface members,
wherein the pair of movable members include the pair of contact surface portions having pushed-up end portions from the pair of back surface members being supporting points, and
wherein the pair of contact surface portions are separated from the pair of back surface members in a relationship in which the front and back pair of contact surfaces are held in conductive contact with each other until the circuit board is inserted, and an elastic property of the pair of contact terminals is set in a relationship that, when the circuit board is inserted between the pair of contact surfaces beyond the preliminary insertion dimension, and then removed, push-out support portions of the pair of movable members are plastically deformed, and the initial gap equal to or less than the thickness dimension of the circuit board is formed between the pair of contact surfaces.

5. The card edge connector according to claim 4,
wherein a pair of elastic hooks are provided at distal end positions of the pair of back surface members of the pair of contact terminals, and a pair of engagement portions to be brought into engagement with the pair of elastic hooks are provided at distal end positions of the pair of movable members,
wherein, when the circuit board is inserted between the pair of movable members, the pair of movable members are separated from each other, and the pair of elastic hooks deform and retreat so that the pair of engagement portions are brought into engagement with the pair of elastic hooks, and
wherein, when the circuit board is removed, the state of engagement of the pair of elastic hooks with the pair of engagement portions is maintained, and the pair of contact surface portions are opposed to each other with the initial gap.

6. The card edge connector according to claim 1,
wherein an end surface fixing member is provided at an end surface position of the circuit board to be inserted between the pair of movable members, and
wherein the end surface fixing member and the plurality of pairs of copper foil terminals are arranged at coordinate positions with common reference holes formed in the circuit board being reference points.

7. The card edge connector according to claim 1,
wherein the pair of movable members comprise a pair of contact surface portions with one of the folded end portions or push-out end portions from the pair of back surface members being supporting points,
wherein the pair of contact surface portions construct arc-shaped curved surfaces with respect to a direction of removing the circuit board, and a non-conductive lubricating material is applied to the pair of contact surface portions, and
wherein rust-proof surface treatment represented by gold plating is applied to the pair of copper foil terminals.

8. The card edge connector according to claim 1,
wherein, one pair of copper foil terminals of the plurality of pairs of copper foil terminals arranged on the circuit board are used as positive-side power supply terminals on both front and back, and another pair of copper foil terminals are used as negative-side power supply terminals on front and back, or at least the positive-side power supply terminals and the negative-side power supply terminals are arranged on one of front surface terminals or back surface terminals of the copper foil terminals of a different pair.

9. The card edge connector according to claim 1,
wherein the contact terminal on the front side of the pair of contact terminals to be brought into contact with the copper foil terminal on the front surface side of the pair of copper foil terminals of the circuit board and the contact terminal on the back side of the pair of contact terminals to be brought into contact with the copper foil terminal on the back surface side of the pair of copper foil terminals have non-symmetrical members having mirrored structures on front and back, and are configured to prevent erroneous insertion on front and back with respect to the connector housing constructing the card edge connector, and
wherein the lead wire on the front surface side to be connected to the contact terminal on the front surface side has a first feature in common color tone, and the lead wire on the back surface side to be connected to the contact terminal on the back surface side has a second feature in common color tone, and the first feature and the second feature are visually distinguished.

* * * * *